US007218150B2

(12) United States Patent
Kitagawa et al.

(10) Patent No.: US 7,218,150 B2
(45) Date of Patent: May 15, 2007

(54) SEMICONDUCTOR INTEGRATED CIRCUIT DEVICE AND DIFFERENTIAL SMALL-AMPLITUDE DATA TRANSMISSION APPARATUS

(75) Inventors: Nobutaka Kitagawa, Machida (JP); Isamu Satoh, Tsukuba-gun (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 10/875,126

(22) Filed: Jun. 22, 2004

(65) Prior Publication Data

US 2005/0140394 A1 Jun. 30, 2005

(30) Foreign Application Priority Data

Dec. 25, 2003 (JP) ............................ 2003-430600

(51) Int. Cl.

| | |
|---|---|
| ***H03K 19/0175*** | (2006.01) |
| ***H03K 19/094*** | (2006.01) |
| ***H03K 19/082*** | (2006.01) |
| ***H03K 17/16*** | (2006.01) |
| ***H03K 19/003*** | (2006.01) |

(52) U.S. Cl. ........................... 326/86; 326/26; 326/27; 326/30; 326/31; 326/32; 326/33; 326/34; 326/82; 326/83; 326/86; 326/87; 326/89; 326/90

(58) Field of Classification Search ................. 326/82, 326/83, 86, 89

See application file for complete search history.

(56) References Cited

U.S. PATENT DOCUMENTS

| | | | | |
|---|---|---|---|---|
| 5,359,294 | A * | 10/1994 | Ganger et al. | 330/258 |
| 5,572,158 | A * | 11/1996 | Lee et al. | 327/175 |
| 6,249,153 | B1 * | 6/2001 | Moraveji | 327/65 |
| 6,542,015 | B2 * | 4/2003 | Zhou et al. | 327/172 |
| 6,664,805 | B2 * | 12/2003 | Gonzalez | 326/26 |
| 6,696,852 | B1 * | 2/2004 | Brunolli | 326/30 |
| 6,720,804 | B2 * | 4/2004 | Taguchi et al. | 327/108 |
| 6,870,390 | B1 * | 3/2005 | Groen et al. | 326/27 |
| 6,891,440 | B2 * | 5/2005 | Straub et al. | 331/1 R |
| 6,898,097 | B2 * | 5/2005 | Dugger et al. | 365/45 |

FOREIGN PATENT DOCUMENTS

| | | |
|---|---|---|
| JP | 7-58559 | 3/1995 |
| JP | 2002-158577 | 5/2002 |

* cited by examiner

*Primary Examiner*—Rexford Barnie
*Assistant Examiner*—Dylan White
(74) *Attorney, Agent, or Firm*—DLA Piper US LLP

(57) ABSTRACT

An output driving circuit has a first and second differential output nodes connected to a first and second external output terminals, respectively. A capacitance connection circuit is connected between the first and second differential output nodes. The capacitance connection circuit connects a capacitance between the first and second differential output nodes. The capacitance connection circuit then adjusts the value of the capacitance in accordance with a control signal.

11 Claims, 6 Drawing Sheets

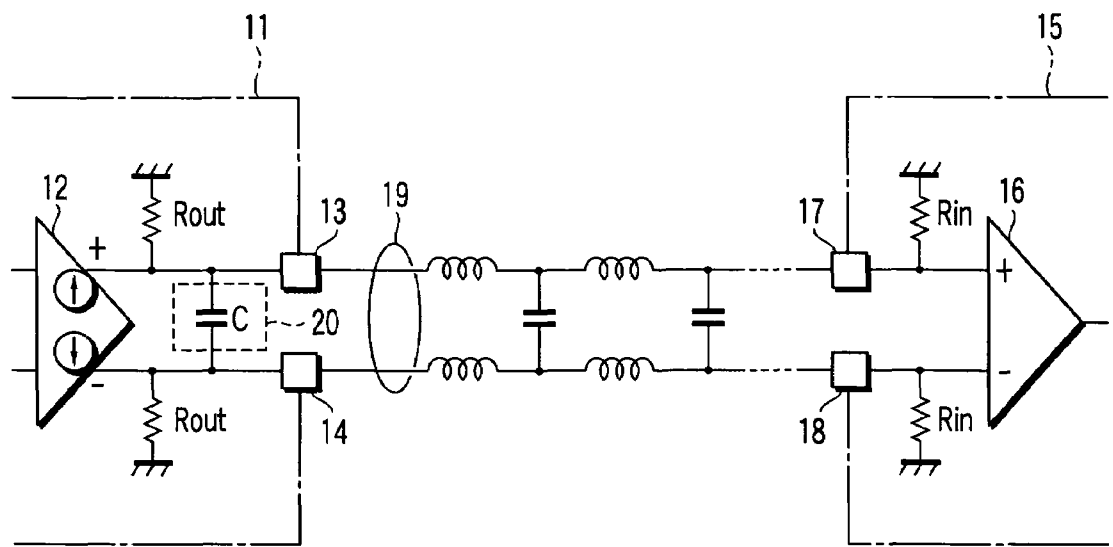
F I G. 1
F I G. 2
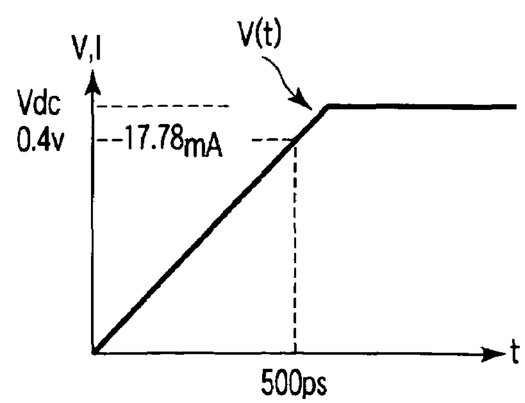
F I G. 3

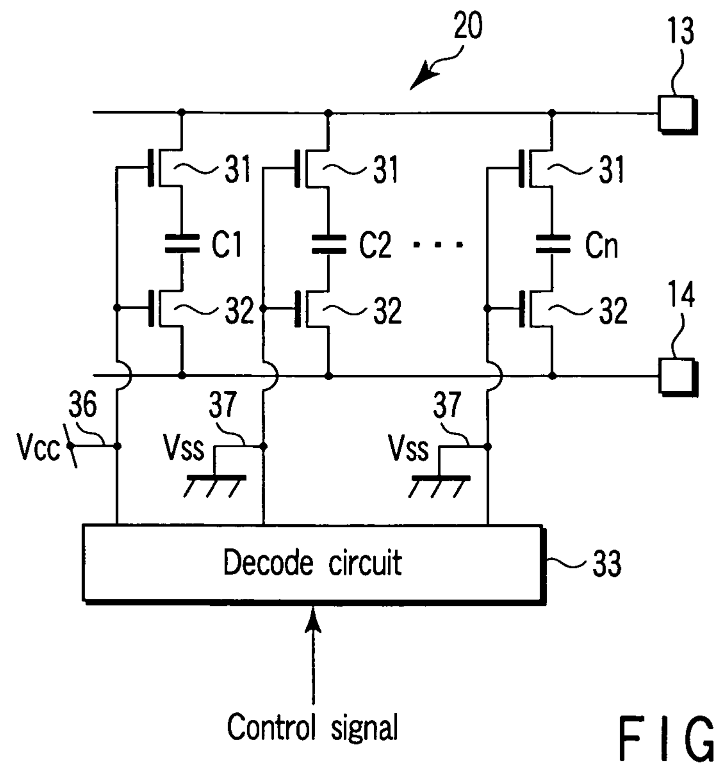
F I G. 6
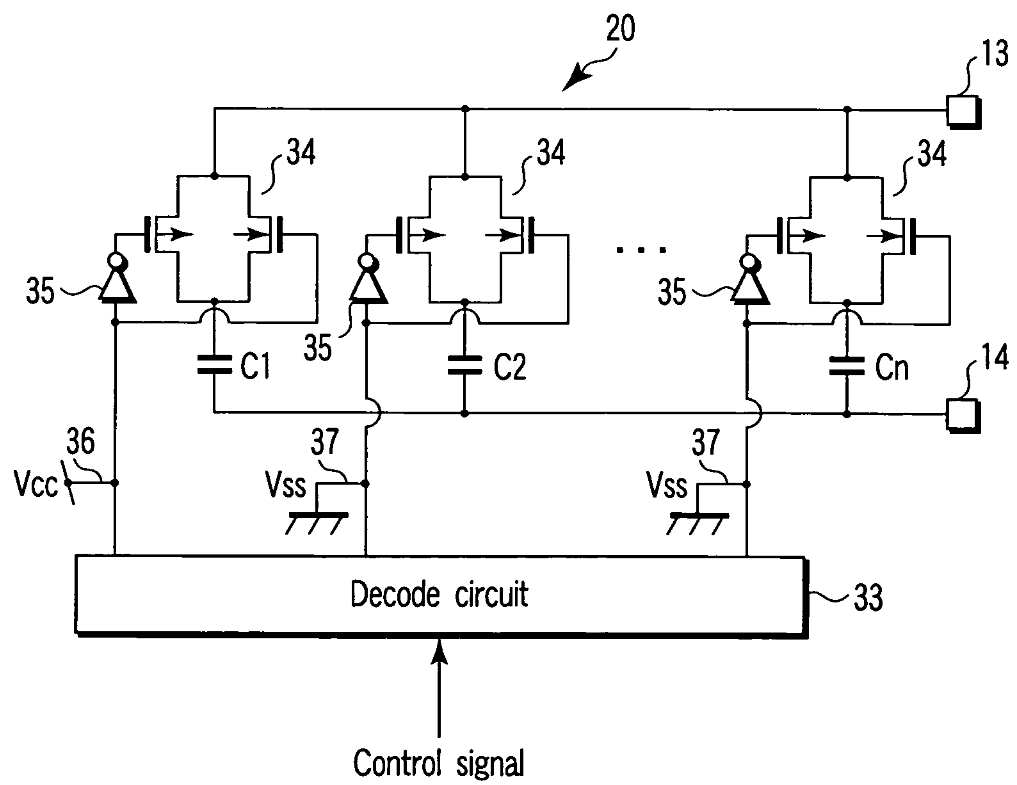
F I G. 7

SEMICONDUCTOR INTEGRATED CIRCUIT DEVICE AND DIFFERENTIAL SMALL-AMPLITUDE DATA TRANSMISSION APPARATUS

CROSS-REFERENCE TO RELATED APPLICATIONS

This application is based upon and claims the benefit of priority from prior Japanese Patent Application No. 2003-430600, filed Dec. 25, 2003, the entire contents of which are incorporated herein by reference.

BACKGROUND OF THE INVENTION

1. Field of the Invention

The present invention relates to a semiconductor integrated circuit device and a differential small-amplitude data transmission device, and in particular, to a differential output driving circuit which has means for adjusting the slew rate of an output signal and which is applied to, for example, an output driving circuit in conformity to a USB standard.

2. Description of the Related Art

If a step voltage is applied to a data output circuit as an input signal, the speed at which an output voltage increases is expressed as $\Delta V/\Delta t$ where $\Delta V$ is a change in voltage and $\Delta t$ is a very short time. The $\Delta V/\Delta t$ is generally called an output slew rate. If the output slew rate of a data output circuit built in a semiconductor integrated circuit device (LSI) must be adjusted to regulate an output waveform from the circuit, a slew rate control amplifier or a slew rate adjusting circuit is provided. Jpn. Pat. Appln. KOKAI Publication No. 7-58559 discloses an example of a slew rate control amplifier having a function to adjust the output slew rate. Further, Jpn. Pat. Appln. KOKAI Publication No. 2002-158577 discloses an example of a slew rate adjusting circuit.

On the other hand, standards such as USB (Universal Serial Bus) 2.0 and IEEE 1394 specify the value of the output slew rate as a part of the specification of a small amplitude data signal inputted as a differential signal. For example, the USB 2.0 standard specifies the value of the output slew rate as 500 pS. Accordingly, in designing a differential output driving circuit that outputs a differential signal, it is important to eliminate the impact of the degradation of an eye pattern waveform as much as possible all over transfer lines, the degradation possibly resulting from an impedance mismatch, a parasitic concentrated capacitance, or an external noise.

In the prior art, to adjust the above described output slew rate of a differential signal in accordance with the specification, the waveform of a driving signal is controlled which is inputted to a gate of a P channel MOS transistor located on a current discharge output side of a differential output driving circuit. However, a long design period is required to obtain a desired signal waveform, thus increasing a design cost. Consequently, it is difficult to realize desired LSI products in a short period.

As described above, the conventional technique to adjust the output slew rate of a differential output driving circuit built in an LSI requires a high design cost and does not allow desired LSI products to be easily manufactured in a short period. It has been desired that these problems be solved.

BRIEF SUMMARY OF THE INVENTION

According to a first aspect of the present invention, there is provided a semiconductor integrated circuit device including an output driving circuit having a first and second differential output nodes connected to a first and second external output terminals, respectively, and a capacitance connection circuit connected between the first and second differential output nodes and having a capacitor connected between the first and second differential output nodes to adjust a value for the capacitor in accordance with a control signal.

According to a second aspect of the present invention, there is provided a data transmission apparatus including a semiconductor integrated circuit device having an output driving circuit having a first and second differential output nodes connected to a first and second external output terminals, respectively, and a capacitor provided outside the semiconductor integrated circuit device between the first and second external output terminals to adjust an output slew rate of the output driving circuit.

BRIEF DESCRIPTION OF THE SEVERAL VIEWS OF THE DRAWING

FIG. 1 is a circuit diagram showing the configuration of a differential output driving circuit built in an LSI according to a first embodiment of the present invention;

FIG. 2 is a diagram showing an equivalent circuit of a circuit composed of a current source provided in the differential output driving circuit and a capacitor provided in a capacitance connection circuit, the differential output driving circuit and capacitance connection circuit being shown in FIG. 1;

FIG. 3 is a graph showing a charging characteristic of the capacitor in the equivalent circuit in FIG. 2 in connection with an output slew rate;

FIG. 6 is a circuit diagram showing an example of a manner of connecting the capacitance connection circuit in FIG. 4;

FIG. 7 is a circuit diagram showing an example of a manner of connecting the capacitance connection circuit in FIG. 5;

DETAILED DESCRIPTION OF THE INVENTION

First Embodiment

Figure 4:
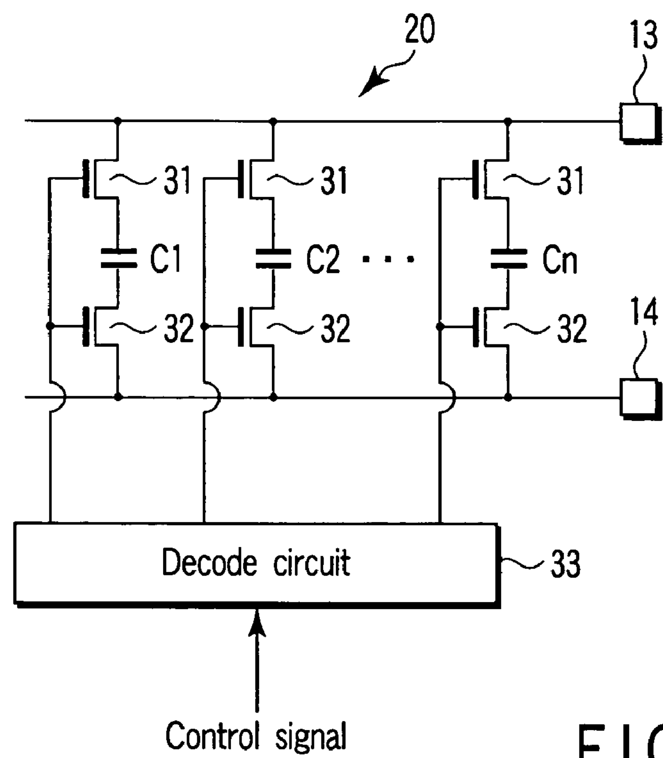
FIG. 4 is a circuit diagram showing an example of the configuration of the capacitance connection circuit in FIG. 1.

FIG. 1 shows the configuration of a semiconductor integrated circuit (LSI) according to a first embodiment. A differential output driving circuit 12 is integrated in a first LSI 11. The differential output driving circuit 12 has a pair of output nodes, one is a positive output node, that is, an output node on a current discharge side, the other is a negative output node, that is, an output node on a current suction side. A pair of output resistors Rout each having a value of 45 Ω is connected between a ground potential and the pair of output nodes of the differential output driving circuit 12. Further, the pair of output nodes is connected to a pair of external output terminals 13 and 14, respectively.

An input amplifying circuit 16 is integrated in a second LSI 15. The input amplifying circuit 16 has a pair of input nodes, one is a positive input node, and the other is a negative input node. A pair of input resistors Rin each having a value of 45 Ω is connected between the ground potential and the pair of input nodes of the differential input amplifying circuit 16. Further, the pair of input nodes of the differential input amplifying circuit 16 is connected to a pair of external input terminals 17 and 18, respectively.

A pair of transfer lines 19 each composed of a cable or the like is connected between the pair of external output terminals 13 and 14 of the first LSI 11 and the pair of external input terminals 17 and 18 of the second LSI 15. The pair of transfer lines 19 has characteristic impedances, that is, a single impedance of 45 Ω and a differential impedance of 90 Ω.

A capacitance connection circuit 20 is connected to the first LSI 11 to connect a capacitor having a desired capacitance value C, between the pair of output nodes of the differential output driving circuit 12. The capacitance value C is adjusted to an arbitrary value in accordance with a control signal as described later. The capacitance connection circuit 20 is configured to have the capacitance value changed, for example, at an arbitrary time in a manufacturing stage. For example, the capacitance connection circuit 20 is configured to allow one of a plurality of capacitors to be arbitrarily connected to the differential output driving circuit.

As shown in FIG. 1, the differential output driving circuit 12 provides an output current constituting a differential pair to the pair of transfer lines 19, having a certain characteristic impedance, to propagate signals. The output current outputted from the differential output driving circuit 12 is provided to the capacitance connection circuit 20 to charge the capacitor in the capacitance connection circuit 20. Thus, the capacitance connection circuit 20 uses extra charges to make the signal waveforms of output signals from the pair of external output terminals 13 and 14 obtuse. The capacitor in the capacitance connection circuit 20 appears to have a double value as viewed from one of the pair of transfer lines 19. Thus, the capacitance in the capacitance connection circuit 20 is more effective than the coupling capacitance between the pair of transfer lines 19. Consequently, the output slew rate is adjusted well.

Accordingly, by using the capacitance connection circuit 20 to set the capacitance value C of the capacitor between the pair of output nodes of the differential output driving circuit 12, it is possible to set the output slew rate at a desired vale to improve the quality of an output waveform from the differential output driving circuit 12 to generate an optimum output waveform in conformity to the eye pattern standard.

FIG. 2 shows an equivalent circuit used to charge a capacitor with the capacitance value C in the capacitance connection circuit 20 using an output current I from a current source in the differential output driving circuit 12. FIG. 3 is a waveform diagram showing the characteristic of the charging of the capacitor with the output current I in connection with the output slew rate. In FIG. 3, V(t) denotes a voltage that increases as a time t passes, and Vdc denotes a saturation voltage (steady voltage). A charging charge Q for the capacitor is given by:

$$Q=I\times t=C\times V \tag{1}$$

On the other hand, the slew rate SR of an output signal is given by:

$$SR=V/t=I/C \tag{2}$$

According to the USB 2.0 standard, a DC impedance per line is (45/2) Ω, and an output DC voltage is 400 mV. Thus, a current of 17.78 mA becomes a DC current. Here, in order to achieve a slew rate of 500 pS, there is no other way but to dynamically vary the current when the current is switched from 0 to 17.78 mA to control the slew rate. Thus, a parasitic capacitance leads to the dependence of a circuit board, a package, a cable, or the like, thus hindering the optimum design from the beginning. It is difficult to optimally design to control the output current from the beginning. In this embodiment, the signal waveforms of output signals outputted from the pair of external output terminals 13 and 14 can be made obtuse by providing the capacitance connection circuit 20, connected between the pair of output nodes of the differential output driving circuit 12, to make part of the output current from the differential output driving circuit 12 available for charging.

Now, description will be given of various examples of the capacitance connection circuit 20 in FIG. 2. The capacitance connection circuit 20, shown in FIG. 4, selects one of a plurality of capacitors C1, C2, . . . Cn to connect it between the pair of output nodes of the differential output driving circuit 12. In this case, to select a capacitor, switch elements and a switch control circuit are provided; the switch elements are connected in series with the respective capacitors and the switch control circuit controls the switch state of the switch elements.

The switch elements are composed of N channel MOS transistors 31 each connected between one end of a corresponding one of the capacitors C1, C2, . . . , Cn and one 13 of the external output terminals, and N channel MOS transistors 32 each connected between the other end of the corresponding one of the capacitors C1, C2,. . . , Cn and the other external output terminal 14. The N channel MOS transistors 31 and 32 constituting a pair and connected to the same one of the capacitors C1, C2, . . . , Cn have respective gates connected together.

The switch control circuit performs such control as sets the logic level of a control signal applied to the common gate of the paired N channel MOS transistors 31 and 32, to "H" or "L" so as to drive any of the switch elements. Thus, for example, a decode circuit 33 is provided which decodes control signals into gate control signals.

Figure 5:
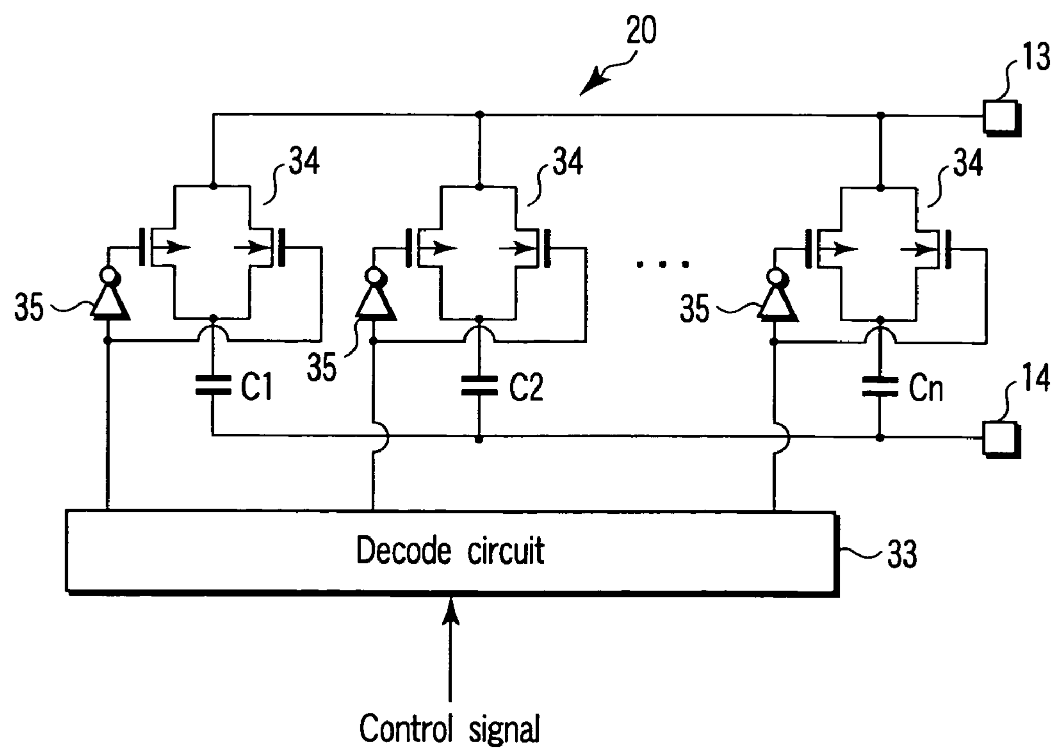
FIG. 5 is a circuit diagram showing another example of the configuration of the capacitance connection circuit in FIG. 1.

The capacitance connection circuit 20, shown in FIG. 5, also selects one of the plurality of capacitors C1, C2, . . . Cn to connect it between the pair of output nodes of the differential output driving circuit 12. In this case, in order to select a capacitor, switch elements and a switch control circuit are provided; the switch elements are connected in series with the respective capacitors and the switch control circuit controls the switch state of the switch elements.

In this case, as the switch element, a CMOS transfer gate 34 is used. The CMOS transfer gate 34 is composed of an N channel MOS transistor and a P channel MOS transistor. Further, the switch control circuit is composed of the decode circuit 33 and a plurality of inverter circuits 35. Each of the inverter circuits 35 generates a complementary switch control signals from an output signal from the decode circuit 33.

When the LSI 11 containing the differential output driving circuit 12 and capacitance connection circuit 20, shown in FIG. 1, is to be newly commercially produced, then the capacitance value C of the capacitor in the capacitance connection circuit 20 is adjusted and set at the optimum value by manufacturing an evaluation sample for the LSI. The determined value is then reflected mass produced LSIs. This makes it possible to improve the quality of the output waveform from the differential output driving circuit 12.

To achieve this, first, for example, during die sort tests, an equivalent load corresponding to the pair of transfer lines in FIG. 1 is connected to the pair of external output terminals 13 and 14. Then, a differential output waveform is observed. Then, the capacitance value C of the capacitance connection circuit 20 is set at the optimum capacitance value so as to generate the optimum output waveform in conformity to the eye pattern standard. Specifically, when the capacitance value C of the capacitor in the capacitance connection circuit 20 is set at the desired value, the decode circuit 33 sequentially selects from the capacitors C1, C2, . . . , Cn. Then, an eye pattern is observed for each capacitor. It is thus possible to select the desired capacitor and set the output slew rate at the desired value. Then, when the LSI to be newly commercially produced is mass-produced, the common gate of the MOS transistors 31 and 32, constituting each switch element, or an input node of the inverter circuit 35 is selectively connected to a power potential node Vcc or a ground node Vss via a wiring pattern 36 or 37, for example, as shown in FIGS. 6 and 7. In this case, the configuration is not limited to the one in which only the one common gate of the MOS transistors 31 and 32 or the one input node of the inverter circuit 35 is connected to the power potential node Vcc using the wiring pattern 36. At least one common gate or at least one input node of the inverter circuit 35 may be connected to the power potential node Vcc. Additionally, in this case, the decode circuit 33 need not be operated.

Therefore, the LSI 11, shown in FIG. 1, enables an operation of generating the optimum output waveform in conformity to the eye pattern standard to be easily performed within a period much shorter than the conventionally required design period.

Figures 8A, 8B, 8C:
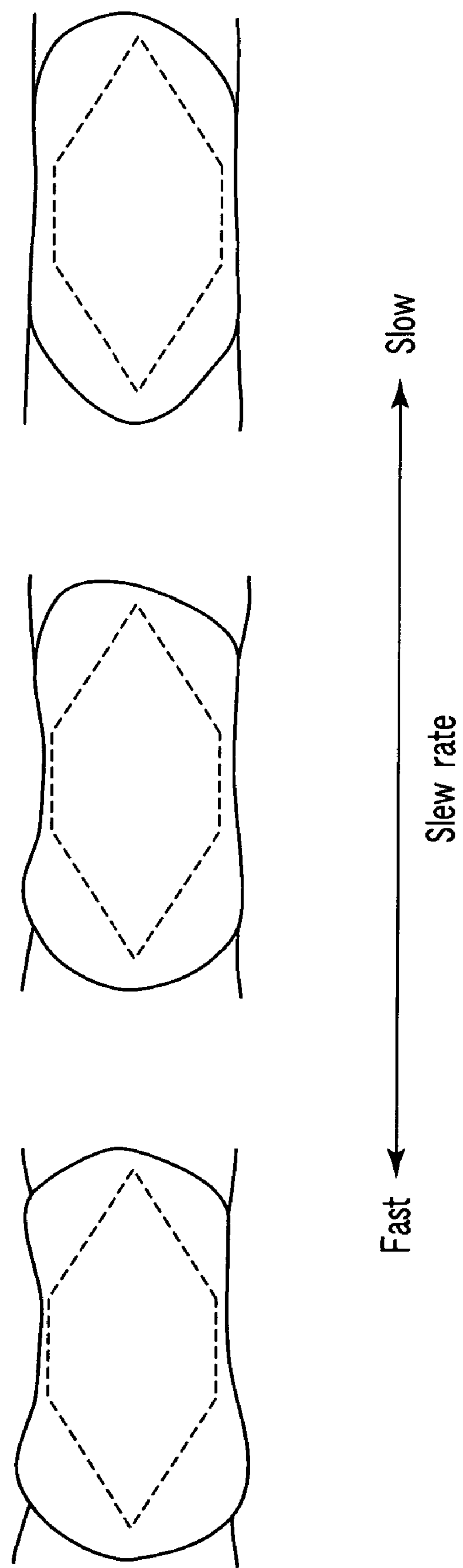
FIGS. 8A to 8C are waveform diagrams showing an example of results of observation of a variation in the eye pattern of an output waveform obtained if the slew rate of the differential output driving circuit in FIG. 1 is varied.

FIGS. 8A to 8C show an example of results of observation of the eye pattern of an output waveform in the case where the output slew rate of the differential output driving circuit 12, shown in FIG. 1, is varied.

FIG. 8A shows that the slew rate is high and that the output signal has a large high frequency component and a disturbed output waveform. FIG. 8C shows that the slew rate is low and that the output signal has a small high frequency component and an insignificantly disturbed output waveform. FIG. 8B shows the eye pattern of an output waveform obtained with an intermediate slew rate between those in FIGS. 8A and 8C. In the prior art, it takes a long design period and is difficult to realize a high-quality eye pattern such as the one shown in FIG. 8C.

In a variation of the capacitance connection circuit 20, two or more of the plurality of capacitors may be connected in series or in parallel, or in series parallel and then connected between the paired output nodes of the differential output driving circuit 12.

Second Embodiment

Figure 9:
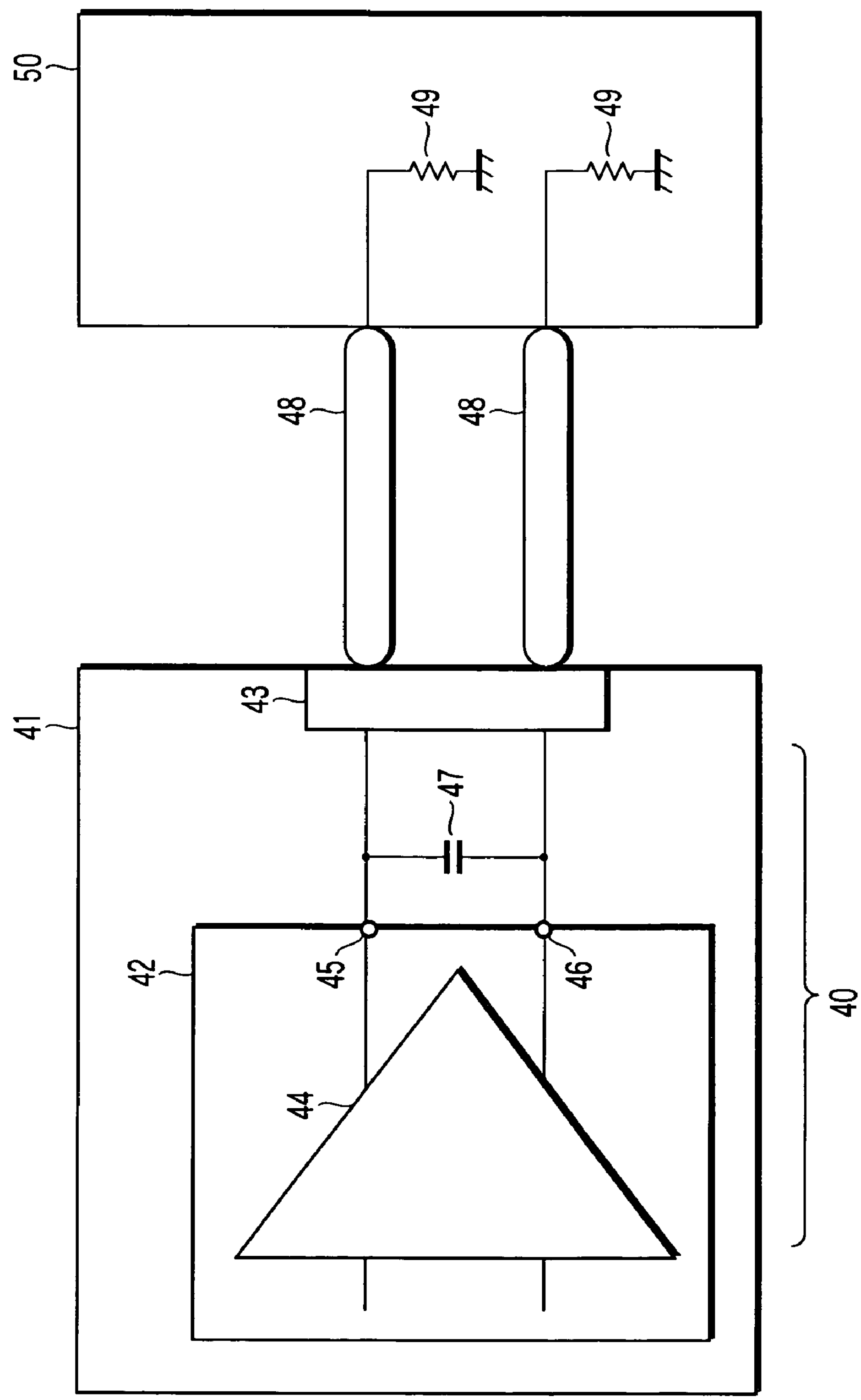
FIG. 9 is a circuit diagram showing the configuration of a differential small-amplitude data transmission apparatus according to a second embodiment of the present invention.

FIG. 9 is a circuit diagram showing the configuration of a differential small-amplitude data transmission apparatus according to a second embodiment. An LSI device 42 and a connector 43 which are packaged are mounted on a first mounting circuit board 41. The LSI device 42 has a built-in differential output driving circuit 44. A pair of output nodes of the differential output driving circuits 44 are connected to a pair of external output terminals 45 and 46, respectively, of the LSI device 42. The pair of external output terminals 45 and 46 are connected to the connector 43.

Moreover, a capacitor 47 having a desired capacitance value is mounted on the first mounting circuit board 41 to adjust the output slew rate. The capacitor 47 is connected between the pair of external output terminals 45 and 46.

To observe the eye pattern of a differential output waveform from the differential output driving circuit 44, one end of each of two transfer cables 48 is connected to the connector 43. Terminals of the transfer cables 48 are connected to pair of load resistors 49 mounted on a second mounting circuit board 50 and operating as matched resistors.

As described above, the differential small-amplitude data transmission apparatus 40 according to the second embodiment is constructed by externally connecting the capacitor 47, having the desired capacitance value and used to adjust the output slew rate, between the pair of output terminals 45 and 46 of the LSI device 42, connected to the pair of output nodes of the differential output driving circuit 44.

Figure 10A:
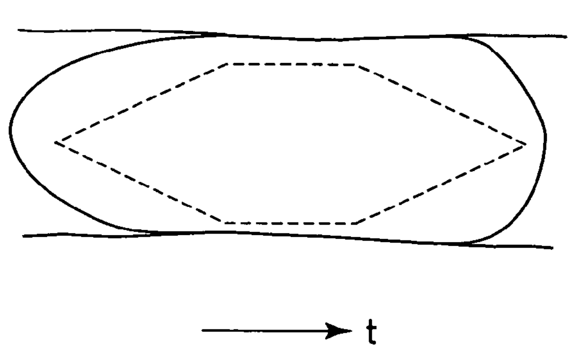
FIG. 10A is a waveform diagram showing an example of results of observation of a variation in the eye pattern of an output waveform from a terminal of a transfer cable in the differential small-amplitude transmission apparatus in FIG. 9.
Figure 10B:
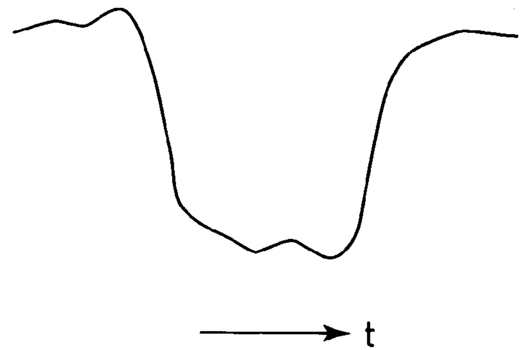
FIG. 10B is a waveform diagram of an input signal inputted to the differential small-amplitude data transmission apparatus in FIG. 9 to observe the eye pattern in FIG. 10A.
Figure 11A:
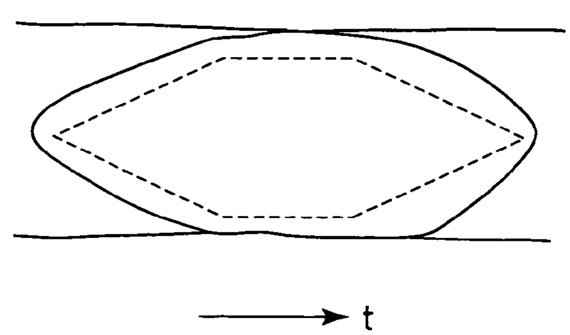
FIG. 11A is a waveform diagram showing an example of results of observation of a variation in the eye pattern of an output waveform from the terminal of the transfer cable in the differential small-amplitude transmission apparatus in FIG. 9, the observation being carried out under conditions different from those in FIG. 10A.
Figure 11B:
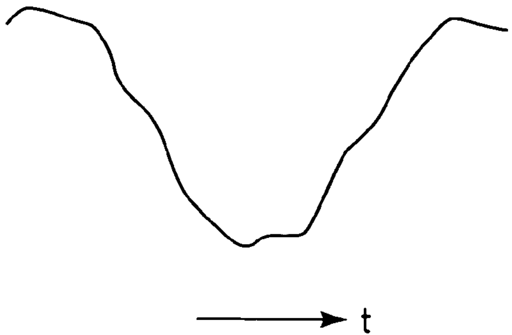
FIG. 11B is a waveform diagram of an input signal inputted to the differential small-amplitude data transmission apparatus in FIG. 9 to observe the eye pattern in FIG. 11A.

FIGS. 10A and 11A show eye patterns observed at the terminals of the transfer cables 47 if the capacitor 47 for adjusting the output slew rate is not connected between the pair of output terminals 45 and 46 of the LSI device 42, shown in FIG. 9 and after capacitor 47 has been externally connected between the pair of output terminals 45 and 46. FIGS. 10B and 11B are waveform diagrams showing input signals observed in the respective cases.

It is assumed that an eye pattern of an output waveform such as the one shown in FIG. 10A is obtained when the capacitor 47 for adjusting the output slew rate is not connected. In this case, by externally installing, for example, a capacitor of 5 pF as the capacitor 47 for adjusting the output slew rate, it is possible to improve the eye pattern of the output waveform and the input signal as shown in FIGS. 11A and 11B.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:

an output driving circuit having a first and second differential output nodes connected to a first and second external output terminals, respectively; and a capacitance connection circuit connected between the first and second differential output nodes, the capacitance connection circuit comprising:

a capacitor connected between the first and second differential output nodes, the capacitor having a capacitance configured for adjustment according to a control signal, the capacitor adjusting a slew rate of an output signal of the output driving circuit;

a plurality of capacitors each having one end and an other end;

a plurality of first switch elements each having one end and an other end, the one end of each first switch element being connected to the first differential output node, the other end of each first switch element being connected to one end of a corresponding one of the plurality of capacitors;

a plurality of second switch elements each having one end and an other end, the one end of each second switch element being connected to the second differential output node, the other end of each second switch element being connected to the other end of a corresponding one of the plurality of capacitors; and a switch control circuit which receives a control signal to select from the plurality of first and second switch elements on the basis of the control signal and perform such control as turns on the selected switch elements.

2. The semiconductor integrated circuit device according to claim 1, wherein the switch control circuit selectively turns on one of the plurality of first switch elements and one of the plurality of second switch elements in accordance with the control signal.

3. The semiconductor integrated circuit device according to claim 1, wherein the switch control circuit simultaneously turns on two or more of the plurality of first switch elements and two or more of the plurality of second switch elements in accordance with the control signal.

4. The semiconductor integrated circuit device according to claim 1, wherein each of the plurality of first and second switch elements is an N channel MOS transistor.

5. A semiconductor integrated circuit device comprising:

an output driving circuit baying a first and second differential output nodes connected to a first and second external output terminals, respectively; and a capacitance connection circuit connected between the first and second differential output nodes, the capacitance connection circuit comprising:

a capacitor connected between the first and second differential output nodes, the capacitor having a capacitance configured for adjustment according to a control signal, the capacitor adjusting a slew rate of an output signal of the output driving circuit;

a plurality of capacitors each having one end and the other end, the one end of each capacitor being connected to one of the first and second differential output nodes;

a plurality of switch elements each having one end end the other end, the one end of each first switch element being connected to the other of the first and second differential output nodes, the other end of each switch element being connected to the other end of a corresponding one of the plurality of capacitors; and a switch control circuit which receives a control signal to select from the plurality of switch elements on the basis oft-he control signal and perform such control as turns on the selected switch elements.

6. The semiconductor integrated circuit device according to claim 5, wherein the switch control circuit turns on one of the plurality of switch elements in accordance with the control signal.

7. The semiconductor integrated circuit device according to claim 5, wherein the switch control circuit simultaneously turns on two or more of the plurality of switch elements in accordance with the control signal.

8. The semiconductor integrated circuit device according to claim 5, wherein each of the plurality of switch elements is a CMOS transfer gate.

9. A semiconductor integrated circuit device comprising:

an output driving circuit having a first and second differential output nodes connected to a first and second external output terminals, respectively; and a capacitance connection circuit having a series circuit including a plurality of capacitors and switch elements connected in series with the respective capacitors, the series circuit being connected in parallel between the first and second differential output nodes, the capacitance connection circuit being provided with a wiring pattern used to select from the plurality of switch elements and turn on the selected switch elements, at least one of the plurality of capacitors being connected between the first and second differential output nodes, said at least one of the plurality of capacitors adjusting a slew rate of an output signal of the output driving circuit.

10. The semiconductor integrated circuit device according to claim 9, wherein each of the plurality of switch elements is an N channel MOS transistor.

11. The semiconductor integrated circuit device according to claim 9, wherein each of the plurality of switch elements is a CMOS transfer gate.

* * * * *